(12) United States Patent
Yokota et al.

(10) Patent No.: US 12,055,562 B2
(45) Date of Patent: Aug. 6, 2024

(54) CONTACT TERMINAL, INSPECTION JIG, AND INSPECTION APPARATUS

(71) Applicant: NIDEC READ CORPORATION, Kyoto (JP)

(72) Inventors: Yusuke Yokota, Kyoto (JP); Norihiro Ota, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 50 days.

(21) Appl. No.: 17/912,057

(22) PCT Filed: Mar. 11, 2021

(86) PCT No.: PCT/JP2021/009931
§ 371 (c)(1),
(2) Date: Sep. 16, 2022

(87) PCT Pub. No.: WO2021/187339
PCT Pub. Date: Sep. 23, 2021

(65) Prior Publication Data
US 2023/0176089 A1 Jun. 8, 2023

(30) Foreign Application Priority Data
Mar. 19, 2020 (JP) ................................ 2020-049472

(51) Int. Cl.
*G01R 1/06* (2006.01)
*G01R 1/067* (2006.01)
(Continued)

(52) U.S. Cl.
CPC ..... *G01R 1/06722* (2013.01); *G01R 1/06738* (2013.01); *G01R 1/073* (2013.01); *H01L 22/00* (2013.01)

(58) Field of Classification Search
CPC .................... G01R 1/06722; G01R 1/06738; G01R 1/073; G01R 3/00; G01R 1/06733; H01L 22/00
See application file for complete search history.

(56) References Cited

U.S. PATENT DOCUMENTS 7,960,988 B2 * 6/2011 Fukami .............. G01R 1/06727
324/755.07
9,506,949 B2 11/2016 Lee et al.
(Continued)

FOREIGN PATENT DOCUMENTS

JP S5914064 U 1/1984
JP 2018179820 A 11/2018
(Continued)

*Primary Examiner* — Alvaro E Fortich
(74) *Attorney, Agent, or Firm* — Viering, Jentschura & Partner mbB

(57) ABSTRACT

A contact terminal includes a tubular body and a first conductor. The tubular body has an end-side cutout provided in a shape cut out from one axial-direction end surface toward an other axial-direction side at one axial-direction end portion of the tubular body, a hole that is open at the one axial-direction end portion, and a pair of arms interposed between the end-side cutout and the hole. The first conductor includes a first insertion including an inclined portion having an outside diameter gradually increased toward one axial-direction side, and a first straight portion connected to the one axial-direction side of the inclined portion and having an outside diameter constant along the axial direction. The outside diameter of the first straight portion is larger than an inside diameter of the tubular body. The first straight portion is configured to be in contact with the pair of arms.

20 Claims, 13 Drawing Sheets

(51) Int. Cl.
  *G01R 1/073* (2006.01)
  *H01L 21/66* (2006.01)

(56) References Cited

U.S. PATENT DOCUMENTS

| | | | |
|---|---|---|---|
| 10,649,004 B2 | 5/2020 | Ota | |
| 2002/0123252 A1* | 9/2002 | Zhou | H01R 13/2407 |
| | | | 439/66 |
| 2013/0099813 A1 | 4/2013 | Hoshino et al. | |
| 2014/0028343 A1* | 1/2014 | Numata | G01R 1/06761 |
| | | | 324/763.01 |
| 2017/0307657 A1* | 10/2017 | Crippa | G01R 1/06716 |
| 2019/0346485 A1 | 11/2019 | Ota | |
| 2019/0383858 A1* | 12/2019 | Yamamoto | G01R 1/06755 |

FOREIGN PATENT DOCUMENTS

| | | |
|---|---|---|
| JP | 2019052996 A | 4/2019 |
| JP | 2019053002 A | 4/2019 |
| JP | 2019138658 A | 8/2019 |

\* cited by examiner

CONTACT TERMINAL, INSPECTION JIG, AND INSPECTION APPARATUS

CROSS-REFERENCE TO RELATED APPLICATIONS

This is a U.S. National Stage Application No. of International Application PCT/JP2021/009931, filed on Mar. 11, 2021, and claims priority under 35 U.S.C. § 119(a) and 35 U.S.C. § 365(b) from Japanese Patent Application No. 2020-049472, filed on Mar. 19, 2020; the disclosures of which are incorporated herein by reference.

FIELD

Various embodiments of the present disclosure relate to a contact terminal used for inspecting an inspection target.

BACKGROUND

Conventionally, a contact terminal to be brought into contact with an inspection target is known. Such a contact terminal is configured by inserting a rod-shaped member having conductivity into a tubular body including a spring at an intermediate position.

In the contact terminal, the rod-shaped member is fastened to a distal end of the tubular body in a state in which an end of the rod-shaped member protrudes from the tubular body. As an example of a method of performing such fastening, a contact terminal in which a rod-shaped member is fastened to a tubular body by press fitting is known.

However, in the contact terminal in which the rod-shaped member is fastened by press fitting as described above, there is room for improvement in assemblability of the rod-shaped member to the tubular body.

SUMMARY

An exemplary contact terminal of the present disclosure includes a tubular body elongated in an axial direction of the contact terminal and having conductivity, and a first conductor having conductivity and a rod shape.

The tubular body has an end-side cutout provided in a shape cut out from one axial-direction end surface toward another axial-direction side at one axial-direction end portion of the tubular body, a hole that is open at the one axial-direction end portion, and a pair of arms interposed between the end-side cutout and the hole.

The first conductor includes a first protrusion protruding from the tubular body toward one axial-direction side, and a first insertion connected to another axial-direction side of the first protrusion and disposed inside the tubular body.

The first insertion includes an inclined portion having an outside diameter gradually increased toward the one axial-direction side, and a first straight portion connected to one axial-direction side of the inclined portion and having an outside diameter constant along the axial direction.

The outside diameter of the first straight portion is larger than an inside diameter of the tubular body. The first straight portion is configured to be in contact with the pair of arms. The first straight portion includes a wall surface disposed at one axial-direction end of the first straight portion and contactable with the hole.

The above and other elements, features, steps, characteristics and advantages of the present disclosure will become more apparent from the following detailed description of embodiments with reference to the attached drawings.

DETAILED DESCRIPTION

Figure 1:
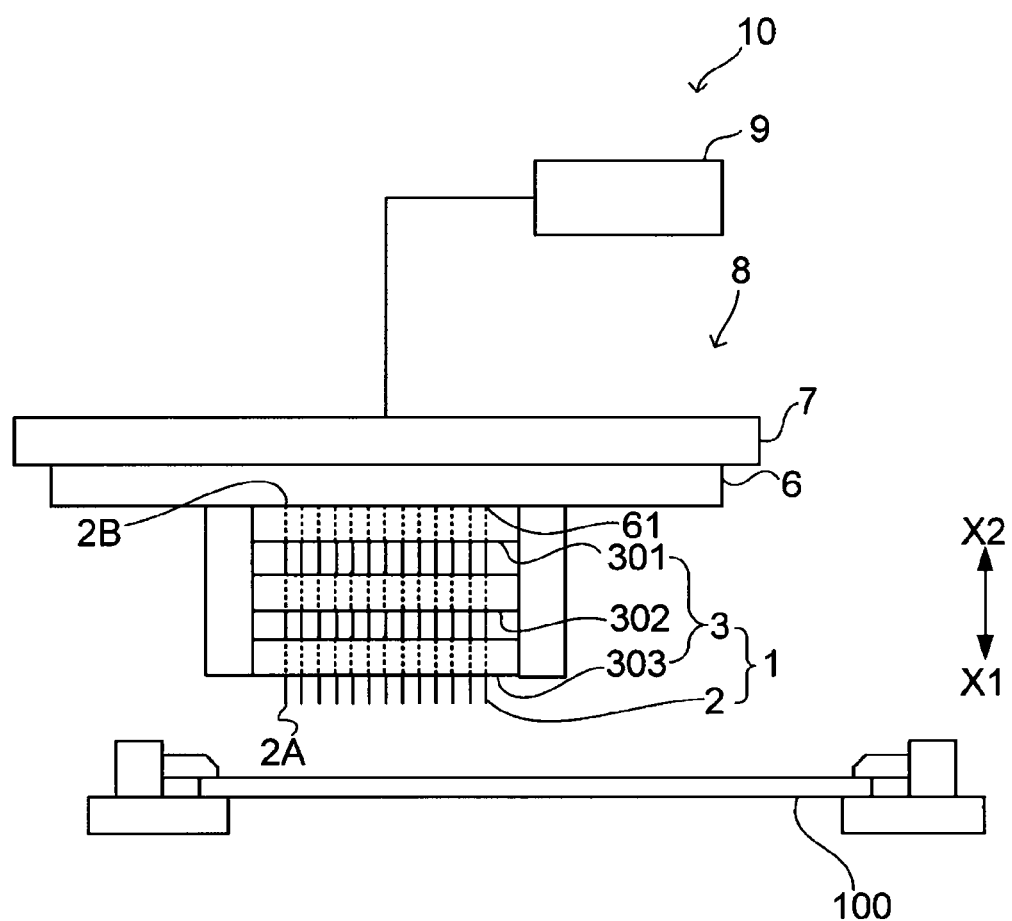
FIG. 1 is a schematic diagram illustrating an overall configuration of an inspection apparatus according to an exemplary embodiment of the present disclosure.

Hereinafter, exemplary embodiments of the present disclosure will be described with reference to the drawings. In the following, a direction parallel to a central axis J (see FIG. 2) of a contact terminal is referred to by the term "axial direction", "axial", or "axially". In the drawings, with the axial direction being defined as X, X1 represents one axial-direction side and X2 represents the other axial-direction side. Moreover, in the drawings, with a direction perpendicular to the axial direction X being defined as a first direction Y, Y1 represents one first-direction side and Y2 represents the other first-direction side. As will be described later, in a tubular body 20, an end-side cutout 31 side is one first-direction Y1 side, and a hole 32 side is the other first-direction Y2 side. Moreover, in the drawings, with a direction perpendicular to the axial direction X and the first direction Y being defined as a second direction Z, Z1 represents one second-direction side and Z2 represents the other second-direction side. In addition, a direction about the central axis J will be referred to by the term "circumferential direction", "circumferential", or "circumferentially".

An overall configuration of an inspection apparatus 10 according to an exemplary embodiment of the present disclosure will be described with reference to FIG. 1. Referring to FIG. 1, a contact terminal 2 is assembled to the inspection apparatus 10 such that one axial-direction X1 side is a lower side.

The inspection apparatus 10 illustrated in FIG. 1 electrically inspects an inspection target 100. The inspection apparatus 10 includes an inspection jig 8 and an inspection processor 9. The inspection jig 8 is configured as, for example, a so-called probe card.

The inspection target 100 is, for example, a semiconductor wafer in which a plurality of circuits is formed on a semiconductor substrate such as silicon. The semiconductor wafer is diced to be divided into semiconductor chips having the individual circuits. In addition to the semiconductor wafer, the inspection target 100 can be, for example, an electronic component such as a semiconductor chip, a chip size package (CSP), a wafer level package (WLP), a fan out wafer level package (FOWLP), or a semiconductor element. The inspection target 100 may also be a board. In this case, the inspection target 100 may be, for example, a board such as a printed circuit board, a glass epoxy board, a flexible board, a ceramic multilayer circuit board, a package board for a semiconductor package, an interposer board, or a film carrier. The inspection target 100 may alternatively be an electrode plate for a display such as a liquid crystal display, an electro-luminescence (EL) display, or a touch screen display, or an electrode plate for a touch screen.

Alternatively, the inspection target 100 may be a product obtained by packaging technology called embedded multi-die interconnect bridge (EMIB). According to EMIB, a small silicon substrate called a silicon bridge is embedded in a package resin board, and fine wires are formed on a surface of the silicon bridge in high density, so that adjacent silicon dies are mounted on the package resin board in proximity to each other.

As illustrated in FIG. 1, the inspection jig 8 includes a probe head 1, a pitch conversion unit 6, and a connection plate 7. The probe head 1 includes the contact terminal (probe) 2 and a support member 3.

The inspection jig 8 includes a plurality of contact terminals 2 and the support member 3 that supports the plurality of contact terminals 2.

The pitch conversion unit 6 is disposed above the support member 3 and fastened to the support member 3. The contact terminal 2 includes one end 2A on the one axial-direction X1 side and the other end 2B on the other axial-direction X2 side. The other end 2B is connected to each of first electrodes 61 (see FIG. 5) provided at a lower end of the pitch conversion unit 6.

The pitch conversion unit 6 converts a first pitch between the contact terminals 2 into a second pitch between second electrodes formed at an upper end of the pitch conversion unit 6. The second pitch is longer than the first pitch. For example, the pitch conversion unit 6 is made up of a multilayer circuit board such as a multi-layer organic (MLO) or a multi-layer ceramic (MLC).

The connection plate 7 is configured such that the pitch conversion unit 6 can be detached therefrom and attached thereto. The pitch conversion unit 6 is electrically connected to the inspection processor 9 via the connection plate 7.

For example, the inspection processor 9 includes a power supply circuit, a voltmeter, an ammeter, and a microcomputer. The inspection processor 9 causes a drive mechanism (not illustrated) to move the inspection jig 8 relative to the inspection target 100.

In a case where the inspection target 100 is, for example, a semiconductor wafer, inspection points such as pads or bumps are formed for each circuit corresponding to an individual semiconductor chip to be obtained by dicing the inspection target 100. The inspection processor 9 defines a certain region of the plurality of circuits on the inspection target 100 as an inspection region, and moves the inspection jig 8 relative to a position at which the contact terminals 2 located above are opposite the inspection points located below in the inspection region. At this time, the one ends 2A of the contact terminals 2 of the inspection jig 8 are directed toward the inspection target 100.

Then, the inspection processor 9 moves the inspection jig 8 downward to bring the contact terminals 2 into contact with the inspection points in the inspection region. In this manner, the inspection points are electrically connected to the inspection processor 9.

The inspection processor 9 supplies a current for inspection or a voltage for inspection to each inspection point of the inspection target 100 via each contact terminal 2 in the foregoing state, and inspects the inspection target 100 based on a voltage signal or a current signal obtained from each contact terminal 2.

That is, the inspection apparatus 10 includes the inspection jig 8 and the inspection processor 9 configured to inspect the inspection target 100 based on an electrical signal obtained by bringing the contact terminal 2 into contact with the inspection point provided in the inspection target 100.

After completion of the inspection on the inspection region in the inspection target 100, the inspection processor 9 moves the inspection jig 8 upward, translates the inspection jig 8 to a position corresponding to a new inspection region, moves the inspection jig 8 downward, and brings the contact terminals 2 into contact with the inspection points in the new inspection region, thus performing the inspection. In this manner, the entire inspection target 100 is inspected by performing the inspection while sequentially changing the inspection region.

Figure 2:
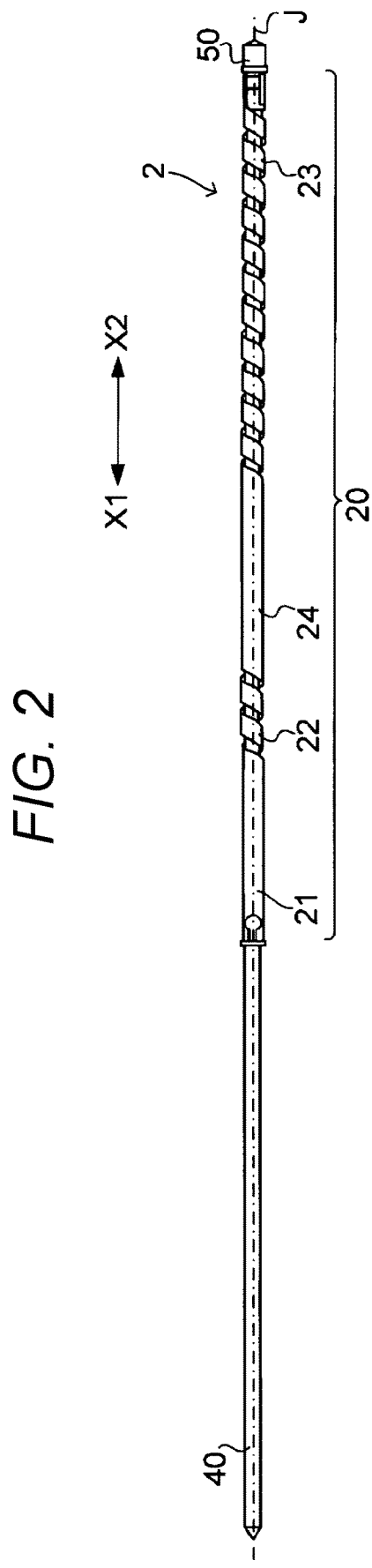
FIG. 2 is a side view illustrating a contact terminal according to the exemplary embodiment of the present disclosure.
Figure 3:
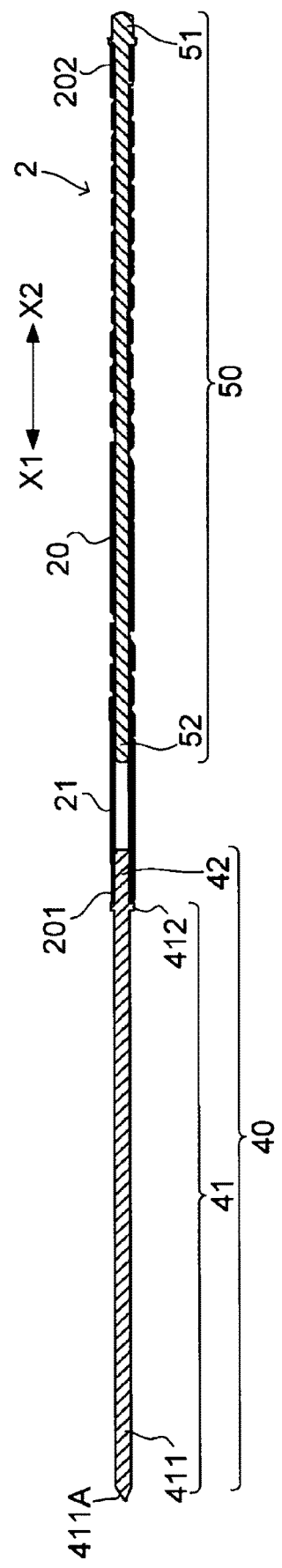
FIG. 3 is a side sectional view illustrating a state in which the configuration of FIG. 2 is cut along a plane parallel to a paper surface.

Hereinafter, the configuration of the contact terminal 2 will be described in more detail. FIGS. 2 and 3 each illustrate a case where no load is applied to the contact terminal 2 and a first spring 22 and a second spring 23 are in a natural length state.

The contact terminal 2 includes the tubular body 20 elongated in the axial direction of the contact terminal 2 and having conductivity, a first conductor (plunger) 40 having conductivity and a rod shape, and a second conductor (plunger) 50 having conductivity and a rod shape. The first conductor 40 and the second conductor 50 are formed of, for example, a conductive material such as a palladium alloy.

The tubular body 20 has a cylindrical shape and is formed from, for example, a nickel tube or a nickel-alloy tube having an outside diameter of about 25 μm to 300 μm and an inside diameter of about 10 μm to 250 μm. For example, the tubular body 20 has, on its inner peripheral surface, a conductive layer such as a gold plating layer. This can reduce contact resistance at a sliding contact point CP (FIG. 4) to be described later. In addition, the tubular body 20 may have an outer peripheral surface coated with an insulation coating as necessary.

The tubular body 20 includes a first body 21, the first spring 22, the second spring 23, and a second body 24. The first body 21, the first spring 22, the second body 24, and the second spring 23 are arranged in this order from the one axial-direction X1 side to the other axial-direction X2 side.

The first spring 22 and the second spring 23 are each formed as a helical body elongated in a helical shape along the peripheral surface of the tubular body 20. The first body 21 and the second body 24 each have a tubular shape that is not formed in a helical shape.

In order to produce a tubular body having such a helical body, for example, a gold plating layer is formed by plating on an outer periphery of a core material, and then a nickel electroforming layer is formed by electroforming on an outer periphery of the formed gold plating layer. A resist layer is formed on an outer periphery of the nickel electroforming layer, and then is exposed with a laser, so that the resist layer is partially removed in a helical shape. Etching is performed using the resist layer as a masking material to remove the nickel electroforming layer at the position where the resist layer is helically removed. Then, after removing the resist layer, the gold plating layer is removed at the position where the nickel electroforming layer is helically removed, and the core material is removed while the gold plating layer is left on an inner periphery of the nickel electroforming layer, thus producing a tubular body.

The first conductor 40 includes a first protrusion 41 and a first insertion 42 (FIG. 3). The first protrusion 41 protrudes from the tubular body 20 toward the one axial-direction X1 side. The first insertion 42 is connected to the other axial-direction X2 side of the first protrusion 41 and disposed inside the tubular body 20. The first conductor 40 and the second conductor 50 each have a rotating body shape around the axial direction. Thus, the first conductor 40 and the second conductor 50 can be formed by cutting using a lathe.

The first protrusion 41 includes a rod-shaped main body 411 and a flange 412 connected to the other axial-direction X2 side of the rod-shaped main body 411. The rod-shaped main body 411 includes a distal end 411A on the one axial-direction X1 side. The distal end 411A is brought into contact with each inspection point of the inspection target 100 as described later.

In the example of FIG. 3, the distal end 411A has a conical shape, but is not limited thereto. For example, the distal end 411A may have a truncated cone shape, a hemispherical shape, a circular cylinder shape, or the like.

The first insertion 42 is connected to the other axial-direction X2 side of the flange 412 and is fastened to the first body 21. More specifically, the first insertion 42 is fastened to one axial-direction end portion 201 of the tubular body 20. The one axial-direction end portion 201 is included in the first body 21. A fastening structure for fastening the first insertion 42 to the first body 21 will be described later.

The second conductor 50 includes a second protrusion 51 and a second insertion 52 disposed inside the tubular body 20 (FIG. 3). The second insertion 52 is connected to the one axial-direction X1 side of the second protrusion 51. The second insertion 52 is fastened to the other axial-direction end portion 202 of the tubular body 20. A fastening structure for fastening the second insertion 52 to the tubular body 20 will be described later.

In this manner, the first conductor 40 and the second conductor 50 are fastened to the tubular body 20, thus forming the contact terminal 2.

As illustrated in FIG. 3, the second insertion 52 is elongated in the axial direction to the first body 21 through the second spring 23, the second body 24, and the first spring 22 inside the tubular body 20. Consequently, the second insertion 52 is in contact with the first body 21.

Figure 4:
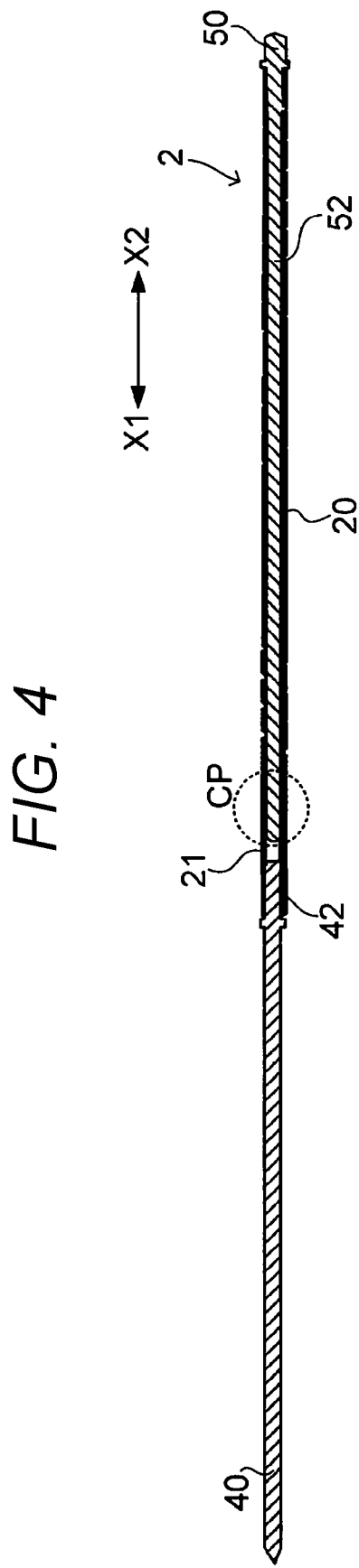
FIG. 4 is a side sectional view illustrating a state in which a load is applied to the contact terminal in the state of FIG. 3.

FIG. 4 illustrates a state in which the first spring 22 and the second spring 23 are compressed by applying a load to the contact terminal 2. In this case, the second conductor 50 moves to the one axial-direction X1 side relative to the first conductor 40 as compared with the state of FIG. 3. Consequently, the second insertion 52 moves to the one axial-direction X1 side while being in contact with the first body 21. Meanwhile, the first insertion 42 is fastened to the first body 21. Thus, the contact between the second insertion 52 and the first body 21 forms a sliding contact point CP. The contact terminal 2 has a current path through the first insertion 42, the first body 21, the sliding contact point CP, and the second insertion 52.

Moreover, as illustrated in FIG. 3, the contact terminal 2, which includes the first conductor 40 of reduced axial length and the second conductor 50 of increased axial length, can reduce a difference between both lengths. Consequently, the first conductor 40 and the second conductor 50 can be easily produced.

Figure 5:
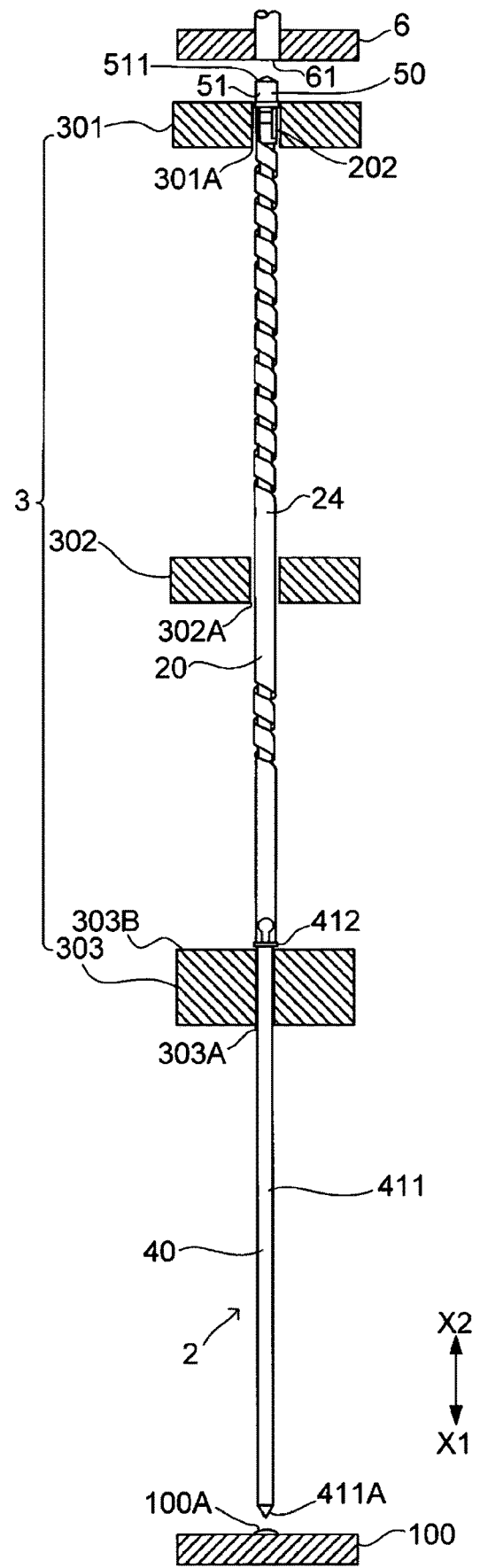
FIG. 5 is an enlarged view of a part of the configuration in FIG. 1.

FIG. 5 is a view illustrating a state in which the contact terminal 2 is supported by the support member 3. As illustrated in FIG. 5, the support member 3 includes an upper support body 301, an intermediate support body 302, and a lower support body 303. Here, a configuration in which the contact terminal 2 is supported by the support member 3 will be described.

The lower support body 303 has a support hole 303A which is a through hole passing through the lower support body 303 in a thickness direction. The support hole 303A has an axially-viewed sectional area slightly larger than an axially-viewed sectional area of the rod-shaped main body 411 and smaller than an axially-viewed sectional area of the flange 412. This allows the rod-shaped main body 411 to be inserted into the support hole 303A, and allows the flange 412 to prevent the contact terminal 2 from falling off.

The intermediate support body 302 is disposed above the lower support body 303 and has a support hole 302A which is a through hole coaxial with the support hole 303A. The support hole 302A has an axially-viewed sectional area slightly larger than an axially-viewed outer sectional area of the second body 24. This allows the second body 24 to be inserted into the support hole 302A.

The upper support body 301 is disposed above the intermediate support body 302 and has a support hole 301A which is a through hole coaxial with the support hole 302A. The support hole 301A has an axially-viewed sectional area slightly larger than axially-viewed outer sectional areas of the other axial-direction end portion 202 of the tubular body 20 and the second protrusion 51. This allows the other axial-direction end portion 202 and the second protrusion 51 to be inserted into the support hole 301A.

When the contact terminal 2 is supported by the support member 3, the rod-shaped main body 411 is sequentially inserted into the support hole 301A, the support hole 302A, and the support hole 303A from above. The support holes 301A and 302A each have an axially-viewed section that allows the flange 412 to be inserted therethrough.

In a state in which the contact terminal 2 is supported by the support member 3 as described above, the rod-shaped main body 411 is received in the support hole 303A. The flange 412 is brought into contact with an upper surface 303B of the lower support body 303. The second body 24 is received in the support hole 302A. The other axial-direction end portion 202 and the second protrusion 51 are received in the support hole 301A.

Then, an upper surface of the upper support body 301 is pressed against a lower surface of the pitch conversion unit 6 while bringing a distal end 511 of the second protrusion 51 into contact with the first electrode 61 exposed on the lower surface of the pitch conversion unit 6. Thus, the support member 3 is fastened to the pitch conversion unit 6. At this time, the first spring 22 and the second spring 23 are axially compressed. This allows the distal end 511 to be pressed against the first electrode 61 by the elastic force of the springs 22 and 23, and allows the distal end 511 and the first electrode 61 to be held in a stable conductive contact state.

Furthermore, in inspecting the inspection target 100, the distal end 411A of the rod-shaped main body 411 is brought into contact with an inspection point 100A of the inspection target 100. At this time, a force toward the other axial-direction X2 side is applied to the distal end 411A, and the first spring 22 and the second spring 23 are axially compressed. This allows the distal end 411A to be pressed against the inspection point 100A by the elastic force of the springs 22 and 23, and allows the distal end 411A and the inspection point 100A to be held in a stable conductive contact state.

In the contact terminal 2, the spring includes the first spring 22 and the second spring 23 disposed on the other axial-direction X2 side with respect to the first spring 22, and the tubular body 20 includes the second body 24 disposed between the first spring 22 and the second spring 23 and not formed in a helical shape. This allows the second body 24 located in the middle of the tubular body 20 to be supported by the intermediate support body 302, and can provide less buckling of the tubular body 20.

Figure 6:
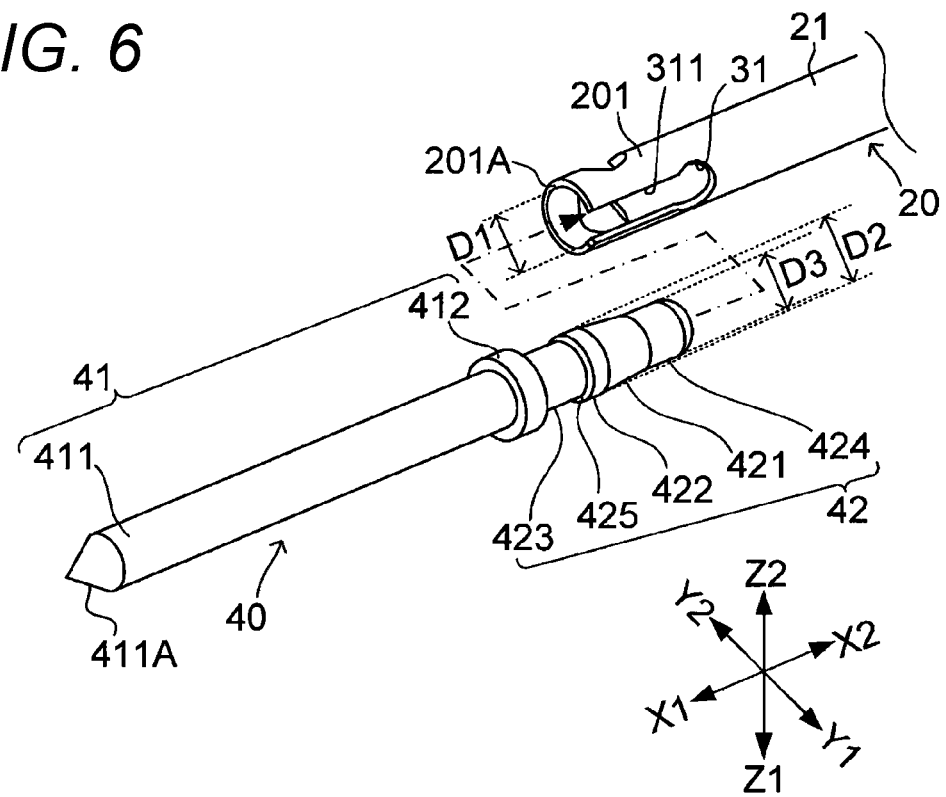
FIG. 6 is a perspective view illustrating an exploded state of a structure, according to a first embodiment, for fastening a first conductor to a tubular body, as viewed from an end-side cutout side.
Figure 7:
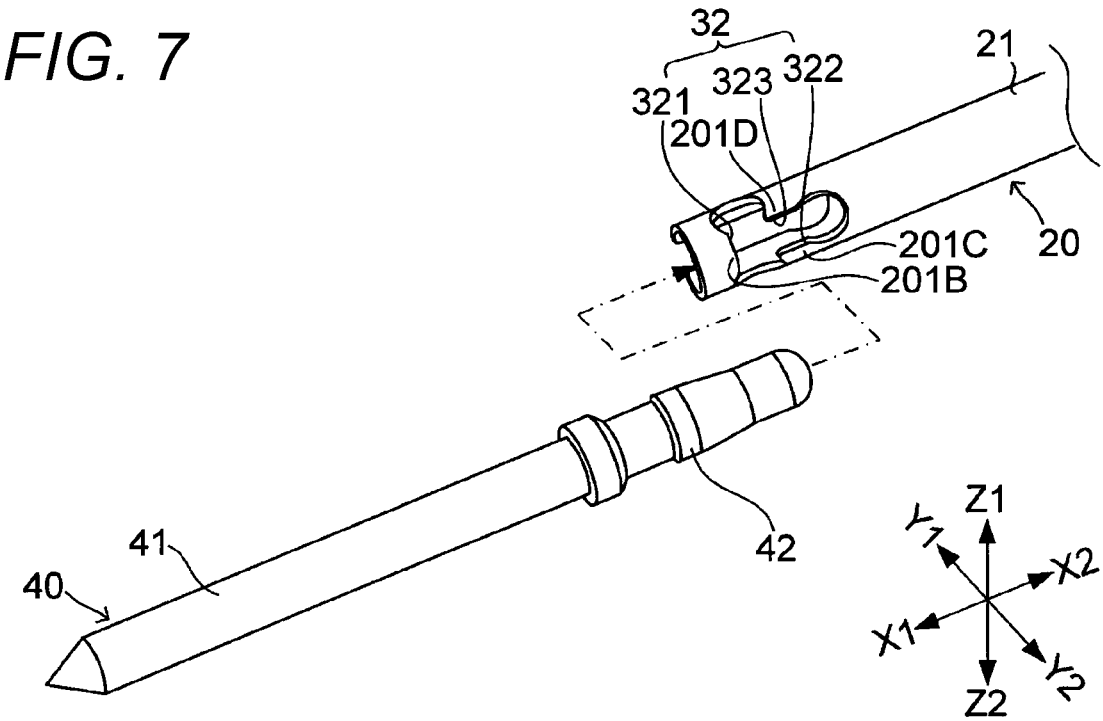
FIG. 7 is a perspective view illustrating an exploded state of the structure, according to the first embodiment, for fastening the first conductor to the tubular body, as viewed from a hole side.

A description will now be given of a first embodiment of a fastening structure for fastening the first conductor 40 of the contact terminal 2 to the tubular body 20. FIGS. 6 and 7 are views each illustrating an exploded state before the first conductor 40 is fastened to the tubular body 20.

The one axial-direction end portion 201 of the tubular body 20 has an end-side cutout 31 and a hole 32.

The end-side cutout 31 (FIG. 6) is formed in a shape cut out toward the other axial-direction X2 side from one axial-direction end surface 201A of the one axial-direction end portion 201. The hole 32 (FIG. 7) is open at the one axial-direction end portion 201. The end-side cutout 31 is provided on the one first-direction Y1 side. The hole 32 is provided on the other first-direction Y2 side. A circumferential center position of the end-side cutout 31 is circumferentially shifted by 180° with respect to a circumferential center position of the hole 32. However, the two circumferential center positions may be slightly shifted from 180°.

That is, the tubular body 20 has the end-side cutout 31 provided in the shape cut out from the one axial-direction end surface 201A toward the other axial-direction X2 side at the one axial-direction end portion 201 of the tubular body 20; and the hole 32 which is open at the one axial-direction end portion 201.

The first insertion 42 (FIG. 6) of the first conductor 40 includes an inclined portion 421, a first straight portion 422, a narrow portion 423, and a second straight portion 424. The inclined portion 421 has an outside diameter gradually increased toward the one axial-direction X1 side. The first straight portion 422 is connected to the one axial-direction X1 side of the inclined portion 421, and has an outside diameter constant along the axial direction.

The first straight portion 422 has an outside diameter D2 larger than an inside diameter D1 of the tubular body 20 (FIG. 6).

The narrow portion 423 is connected to the one axial-direction X1 side of the first straight portion 422 and is connected to the other axial-direction X2 side of the flange 412. The narrow portion 423 has an outside diameter smaller than the outside diameter of the first straight portion 422.

The second straight portion 424 is connected to the other axial-direction X2 side of the inclined portion 421, and has an outside diameter constant along the axial direction.

When the first conductor 40 is assembled to the tubular body 20, the second straight portion 424 is inserted into the tubular body 20 from the one axial-direction end surface 201A. As the insertion proceeds, the inclined portion 421 comes into contact with an inner periphery of the one axial-direction end surface 201A. As the first conductor 40 is pushed in as it is, the one axial-direction end portion 201 expands, and the first straight portion 422 is inserted into the tubular body 20.

Figure 8:
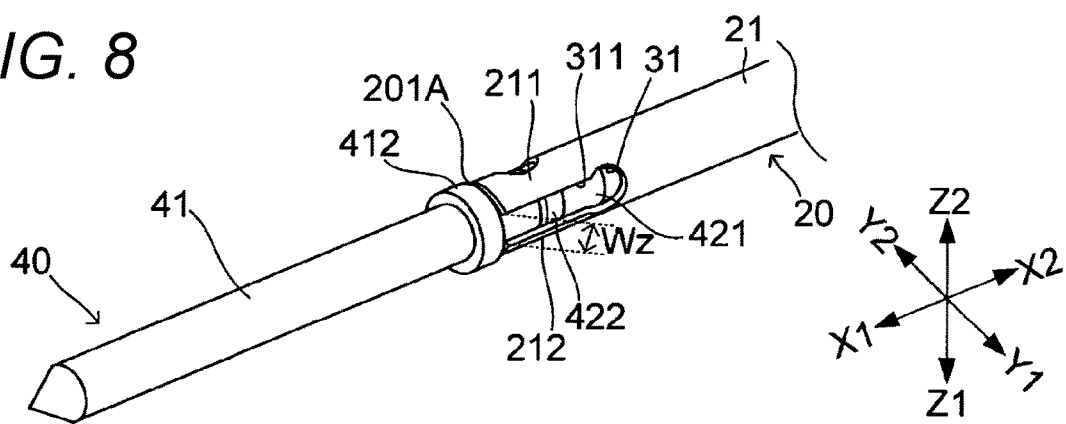
FIG. 8 is a perspective view illustrating a state in which the first conductor is assembled to the tubular body in FIG. 6.
Figure 9:
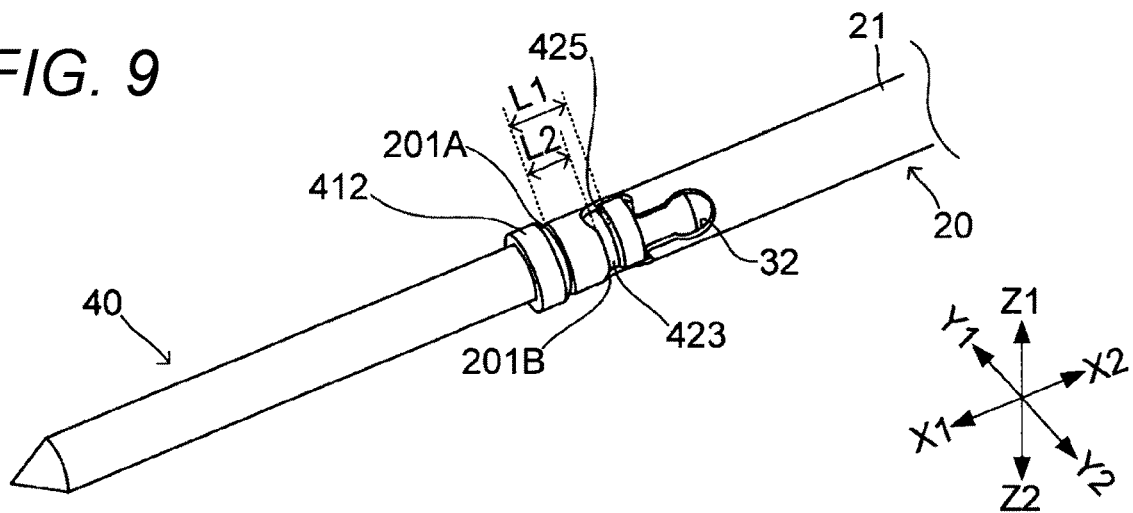
FIG. 9 is a perspective view illustrating a state in which the first conductor is assembled to the tubular body in FIG. 7.

As the insertion further proceeds, the flange 412 comes into contact with the one axial-direction end surface 201A, thus restricting the insertion of the first conductor 40. FIGS. 8 and 9 each illustrate a state in which the first conductor 40 is pushed into the tubular body 20 and the flange 412 is in contact with the one axial-direction end surface 201A. FIG. 8 illustrates a state in which the first conductor 40 is inserted into the tubular body 20 in FIG. 6. FIG. 9 illustrates a state in which the first conductor 40 is inserted into the tubular body 20 in FIG. 7.

In the states illustrated in FIGS. 8 and 9, the first straight portion 422 is pinched from both sides in the second direction Z by a pair of arms 211 and 212 of the tubular body 20. The arms 211 and 212 are interposed between the end-side cutout 31 and the hole 32.

Since the outside diameter D2 of the first straight portion 422 is larger than the inside diameter D1 of the tubular body 20, the first straight portion 422 is pressed by the pair of arms 211 and 212. That is, the first straight portion 422 is in contact with the arms 211 and 212. This allows the first conductor 40 to be fastened to the tubular body 20.

A wall surface 425 is formed in the level-difference portion between the first straight portion 422 and the narrow portion 423 (FIG. 6). Here, as illustrated in FIG. 9, a distance L1 between the wall surface 425 and the flange 412 is longer than a distance L2 between the hole 32 and the one axial-direction end surface 201A. Consequently, in the state of FIG. 9, the narrow portion 423 is fitted between the hole 32 and the one axial-direction end surface 201A. The wall surface 425 is contactable with an axially protruding edge 321 included in the hole 32. The axially protruding edge 321 is an edge of an axial protrusion 201B protruding toward the other axial-direction X2 side at the one axial-direction end portion 201.

That is, the wall surface 425 disposed at the one axial-direction end of the first straight portion 422 is contactable with the hole 32. This allows the first conductor 40 assembled to the tubular body 20 to be less likely to come off from the tubular body 20. In addition, since the wall surface 425 is contactable with the axially protruding edge 321 (FIG. 7), the first conductor 40 is much less likely to come off from the tubular body 20. Furthermore, it is possible to prevent the wall surface 425 from being in contact with a portion near both circumferential ends of the axially protruding edge 321.

Figure 19:
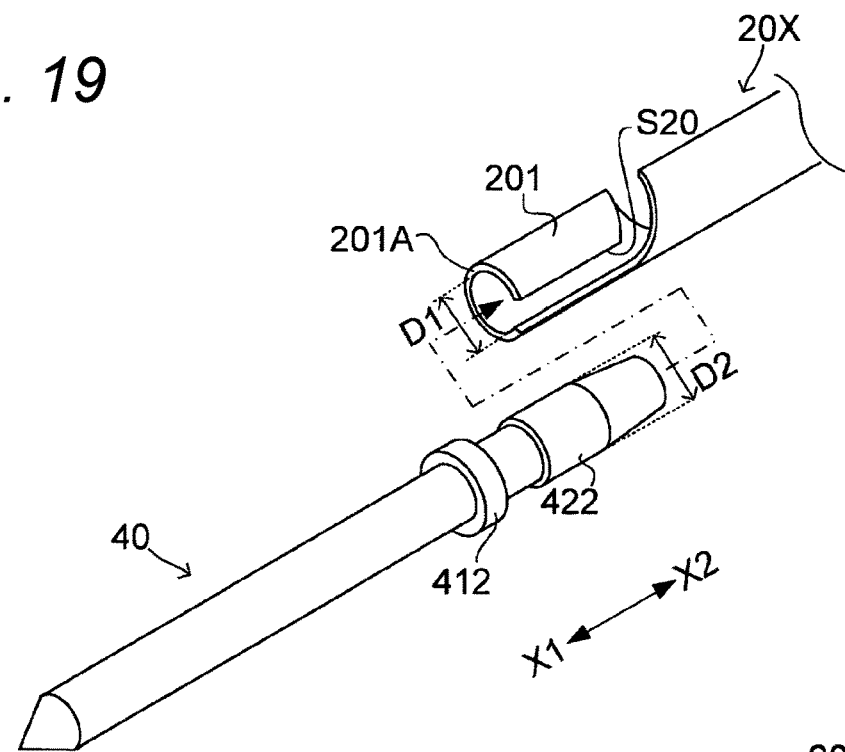
FIG. 19 is a perspective view illustrating an exploded state of a structure, according to a comparative example, for fastening a first conductor to a tubular body.
Figure 20:
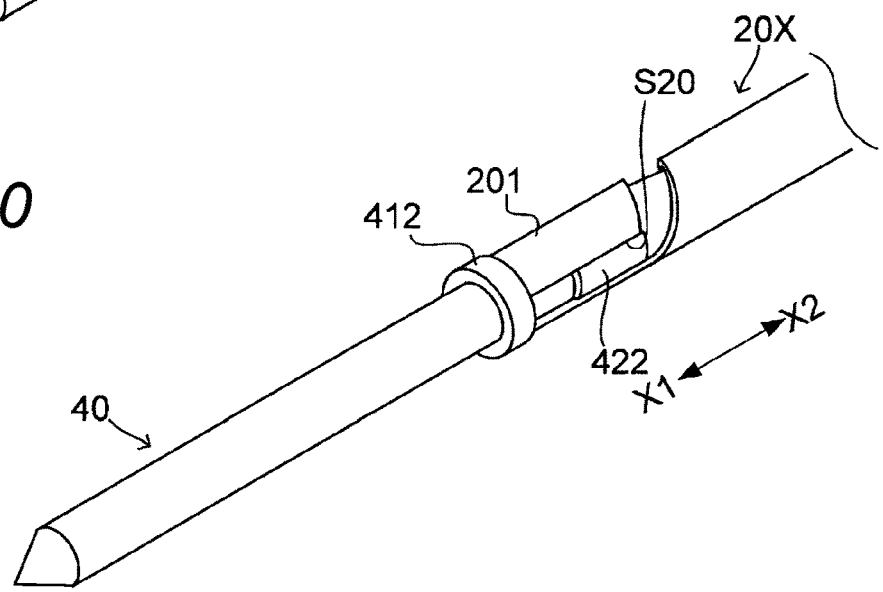
FIG. 20 is a perspective view illustrating a completed state of the structure, according to the comparative example, for fastening the first conductor to the tubular body.

Here, as illustrated in FIG. 19, if the one axial-direction end portion 201 of a tubular body 20X has no hole but only an end-side cutout S20, a state in which the first conductor 40 is assembled to the tubular body 20X is as illustrated in FIG. 20. At this time, the one axial-direction end portion 201 having only the end-side cutout S20 results in little expansion at the time of inserting the first conductor 40 into the tubular body 20X.

On the other hand, in the contact terminal 2 according to the present embodiment, since the tubular body 20 has the end-side cutout 31 and the hole 32, the one axial-direction end portion 201 easily expands. Thus, the first conductor 40 is easily pushed into the tubular body 20, and the first conductor 40 is easily assembled to the tubular body 20.

As illustrated in FIGS. 8 and 9, the first protrusion 41 includes the flange 412 axially facing the one axial-direction end surface 201A of the tubular body 20. This can reduce excessive insertion of the first conductor 40 at the time of inserting the first conductor 40 into the tubular body 20.

Figure 21:
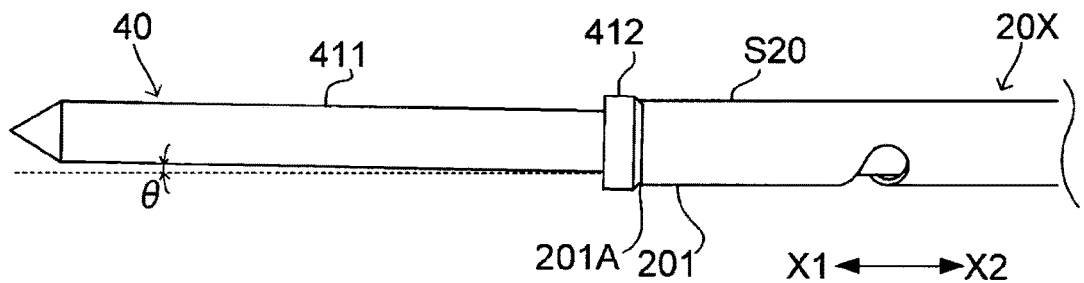
FIG. 21 is a side view illustrating the completed state of the structure, according to the comparative example, for fastening the first conductor to the tubular body.

When the first conductor 40 is inserted into the tubular body 20X illustrated in FIG. 19, the first straight portion 422 having the outside diameter D2 larger than the inside diameter D1 of the tubular body 20X acts to expand the one axial-direction end portion 201 of the tubular body 20X. At this time, a portion of the one axial-direction end portion 201 near the end portion on the other axial-direction X2 side of the end-side cutout S20 moves in the circumferential direction of the tubular body 20X. The portion of the tubular body 20X brought into contact with the first straight portion 422 moves radially outward of the tubular body 20X. Thus, the one axial-direction end portion 201 of the tubular body 20X is expanded. At this time, the axial center of the one axial-direction end portion 201 is shifted from the axial center of the one axial-direction end portion 201 having no first conductor 40 being inserted. As illustrated in FIG. 20, when the first conductor 40 is inserted until the flange 412 comes into contact with the one axial-direction end surface 201A, the displacement of the axial center near the one axial-direction end surface 201A is large. Thus, the first conductor 40 is easily inclined from the direction along the axial center of the tubular body 20X having no first conductor 40 being inserted. The first conductor 40 is inclined toward the end-side cutout S20. FIG. 21 illustrates a state in which the first conductor 40 is inclined at an angle θ.

Figure 10:
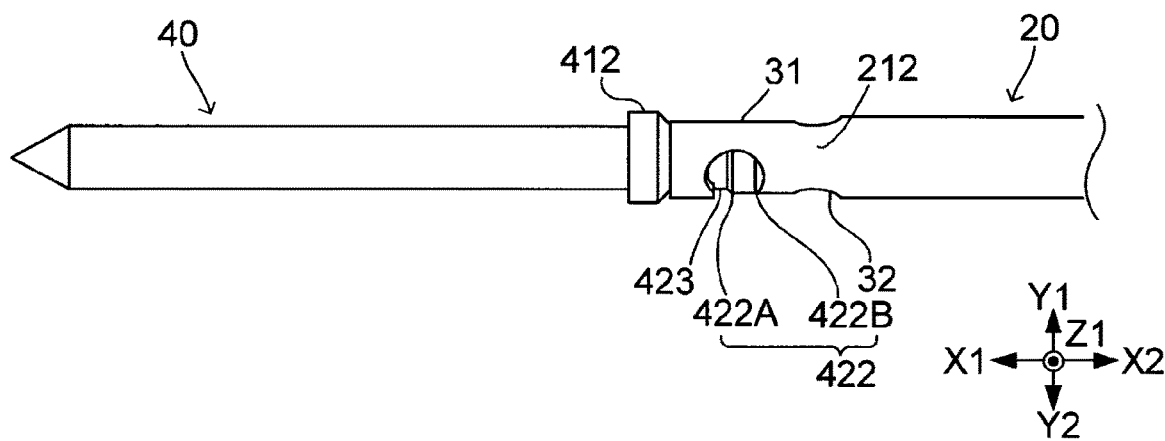
FIG. 10 is a side view illustrating the state of FIG. 8 in which the first conductor is assembled to the tubular body.

On the other hand, in the contact terminal 2 according to the first embodiment, as illustrated in FIG. 10, the first straight portion 422 is partially exposed from the hole 32 from one axial-direction end 422A to the other axial-direction end 422B along the axial direction. That is, the first straight portion 422 is partially exposed from the hole 32. This allows the exposed portion of the first straight portion 422 not to be in contact with the tubular body 20, thus reducing inclination of the first conductor 40 with respect to the tubular body 20.

The second straight portion 424 has an outside diameter D3 (FIG. 6) substantially identical to the inside diameter D1 of the tubular body 20. This can reduce inclination of the first conductor 40 with respect to the tubular body 20. As long as a relationship between the outside diameter D3 and the inside diameter D1 satisfies $0 < D1-D3 \leq 6$ μm, the above effect can be obtained. For example, in a case where the tubular body 20 has an inside diameter D1 of 47 μm and an outside diameter of 58 μm, provided that the second straight portion 424 has an outside diameter D3 of 45 μm, the above effect can be obtained.

In addition, as illustrated in FIG. 7, the one axial-direction end portion 201 includes a pair of circumferential protrusions 201C and 201D protruding in the circumferential direction so as to approach each other. The hole 32 includes circumferential protruding edges 322 and 323 that are edges of the circumferential protrusions 201C and 201D. The first conductor 40 is held by the circumferential protrusions 201C and 201D, thus reducing the inclination of the first conductor 40 (FIG. 9).

Figure 11:
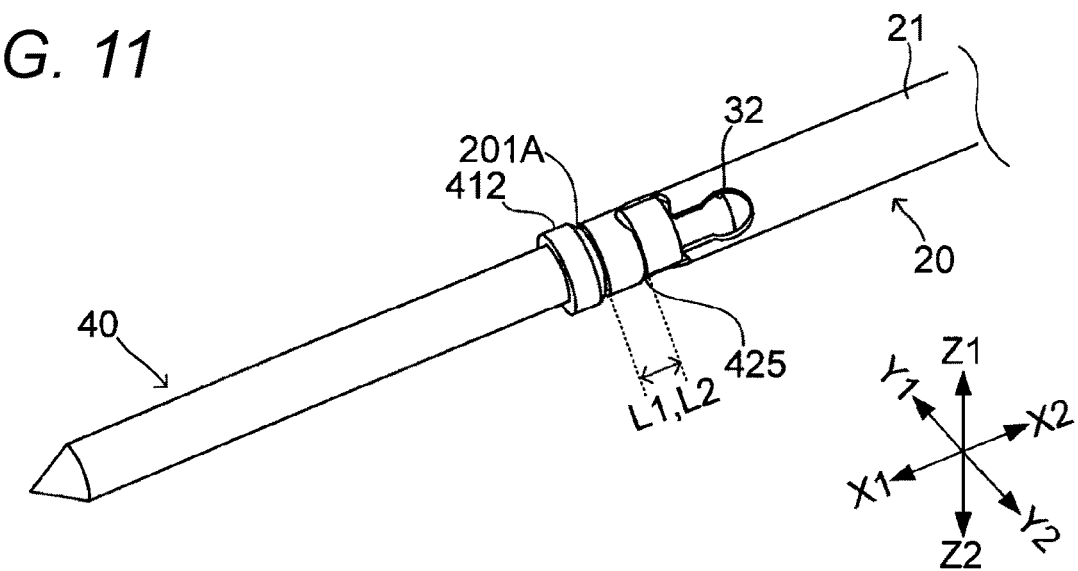
FIG. 11 is a perspective view illustrating a modification of the first embodiment.
Figure 12:
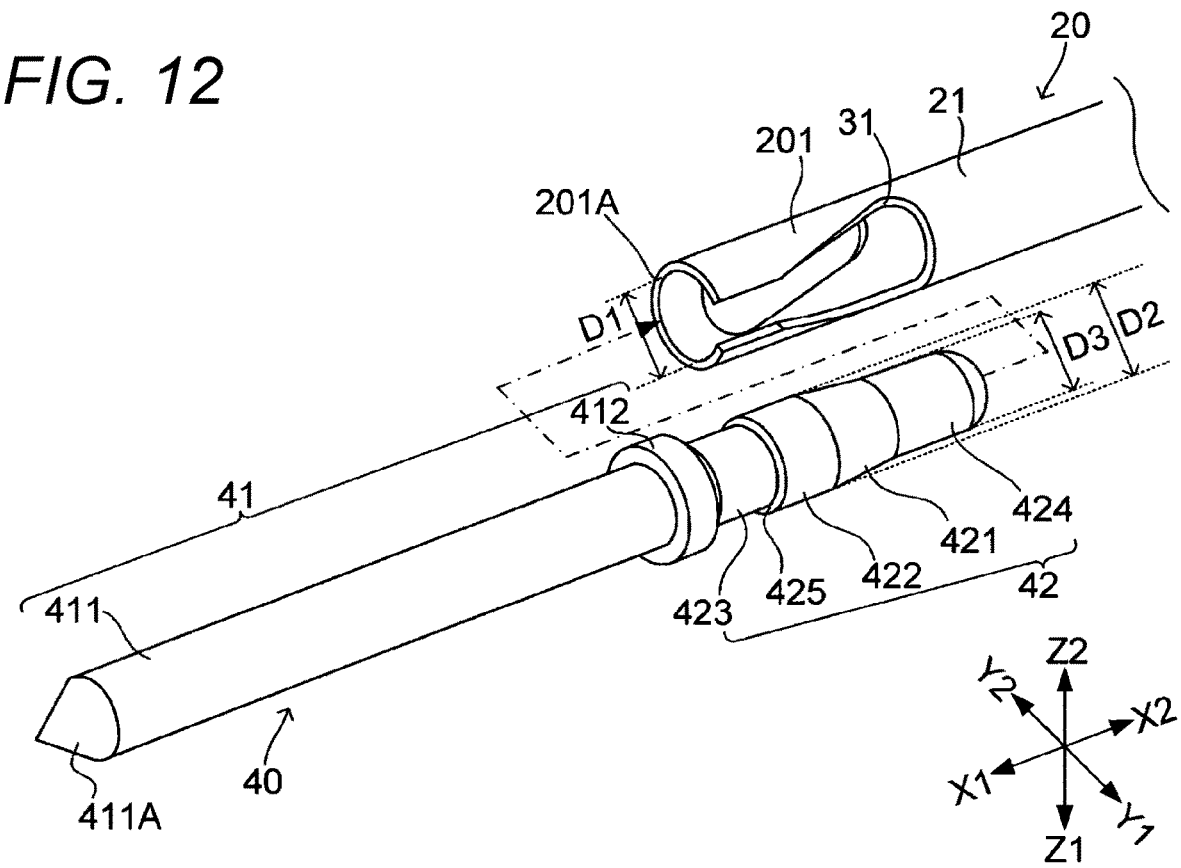
FIG. 12 is a perspective view illustrating an exploded state of a structure, according to a second embodiment, for fastening the first conductor to a tubular body, as viewed from an end-side cutout side.
Figure 13:
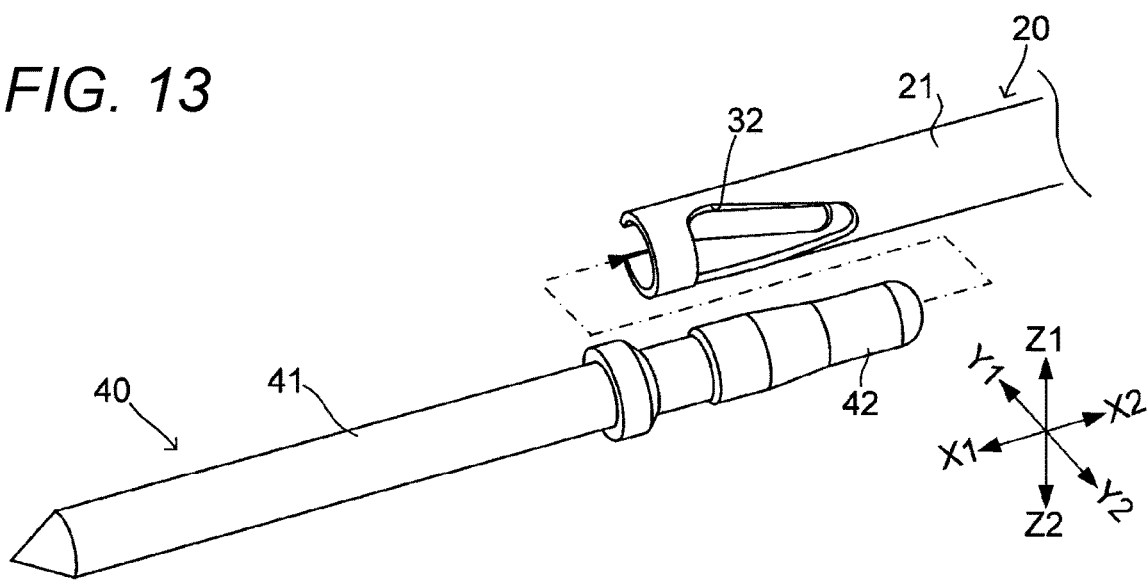
FIG. 13 is a perspective view illustrating an exploded state of the structure, according to the second embodiment, for fastening the first conductor to the tubular body, as viewed from a hole side.
Figure 14:
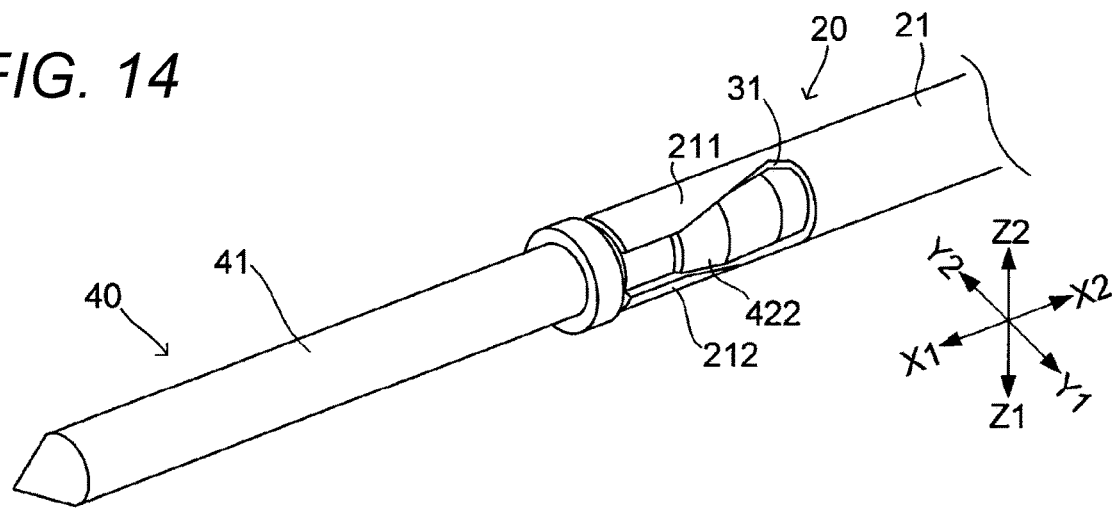
FIG. 14 is a perspective view illustrating a state in which the first conductor is assembled to the tubular body in FIG. 12.
Figure 15:
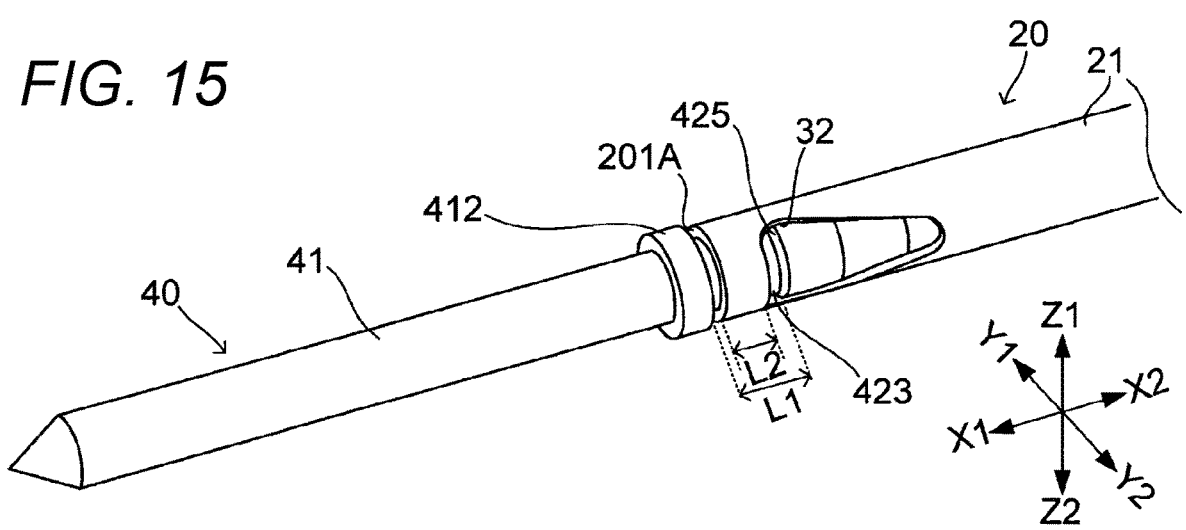
FIG. 15 is a perspective view illustrating a state in which the first conductor is assembled to the tubular body in FIG. 13.
Figure 16:
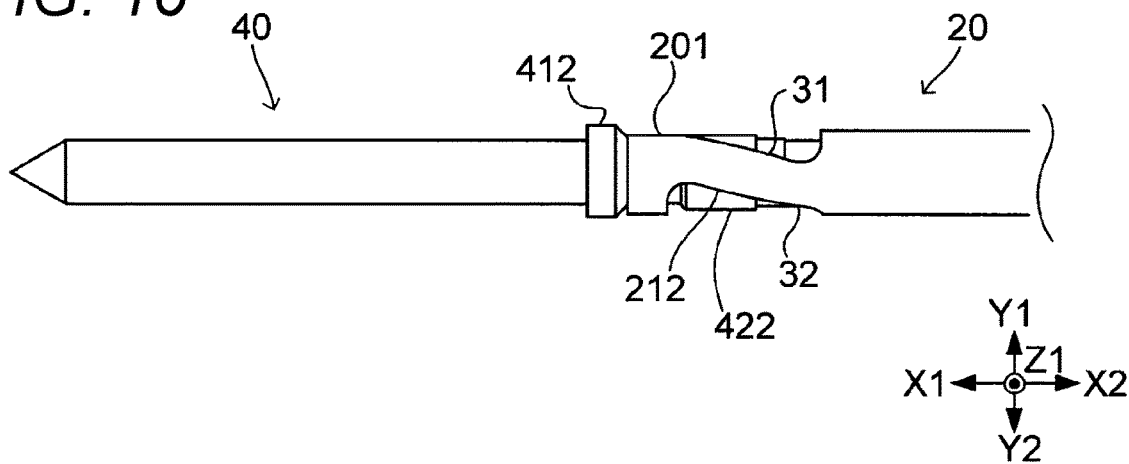
FIG. 16 is a side view illustrating the state of FIG. 14 in which the first conductor is assembled to the tubular body.

As a modification of the present embodiment, as illustrated in FIG. 11, the distance L1 between the wall surface 425 and the flange 412 may be substantially equal to the distance L2 between the hole 32 and the one axial-direction end surface 201A. This can reduce the axial movement of the first conductor 40 with respect to the tubular body 20. As long as a relationship between the distances L1 and L2 satisfies $0 \leq L1-L2 \leq 30$ μm, the above effect can be obtained.

As illustrated in FIG. 8, the end-side cutout 31 includes a constant width portion 311 having a width Wz constant along the axial direction. The constant width portion 311 is elongated from the one axial-direction end surface 201A to a position overlapping the inclined portion 421 as viewed in the first direction Y. This allows the first conductor 40 to be held by the portion near the constant width portion 311 in the tubular body 20, and can reduce the inclination of the first conductor 40.

FIGS. 12 to 18 are views each illustrating a second embodiment of a structure for fastening the first conductor 40 to the tubular body 20. In the first conductor 40 and the tubular body 20 according to the second embodiment, components corresponding to those in the first embodiment are denoted by the same reference numerals as those in the first embodiment. Thus, the second embodiment can achieve the same operational effects as those based on the foregoing distinctive features of the first embodiment. Here, the shapes of the end-side cutout 31 and the hole 32, which are differences from the first embodiment, will be described in detail with reference to FIGS. 17 and 18.

Figure 17:
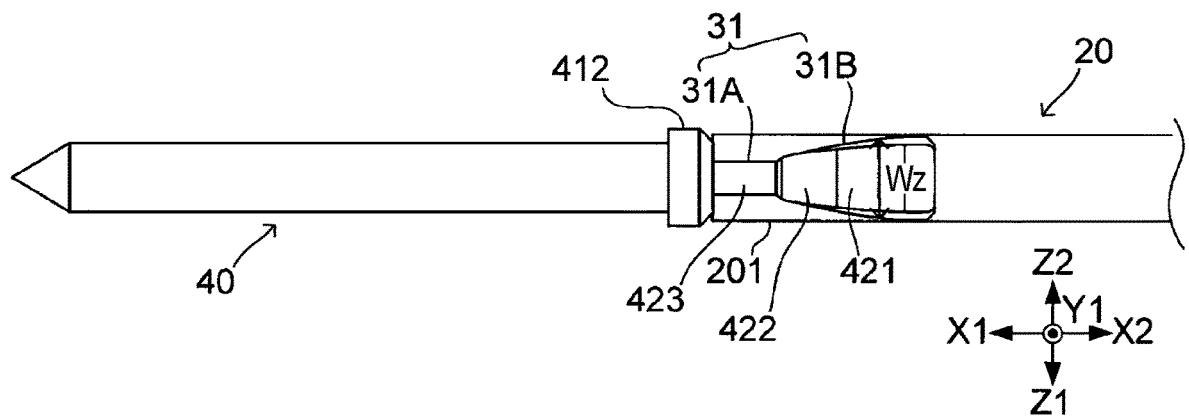
FIG. 17 is a side view illustrating the state of FIG. 14 in which the first conductor is assembled to the tubular body, as viewed from the end-side cutout side.

As illustrated in FIG. 17, the end-side cutout 31 includes a constant width portion 31A and a wide portion 31B. The constant width portion 31A has a width Wz constant along the axial direction from the one axial-direction end surface 201A. The wide portion 31B is connected to the other axial-direction X2 side of the constant width portion 31A, and has a width Wz gradually increased toward the other axial-direction X2 side.

That is, the end-side cutout 31 includes the wide portion 31B having the width Wz gradually increased toward the other axial-direction X2 side. Largely cutting out the end-side cutout 31 allows the one axial-direction end portion 201 of the tubular body 20 to be more easily expanded. In addition, inclination of the first conductor 40 with respect to the tubular body 20 can be reduced.

Figure 18:
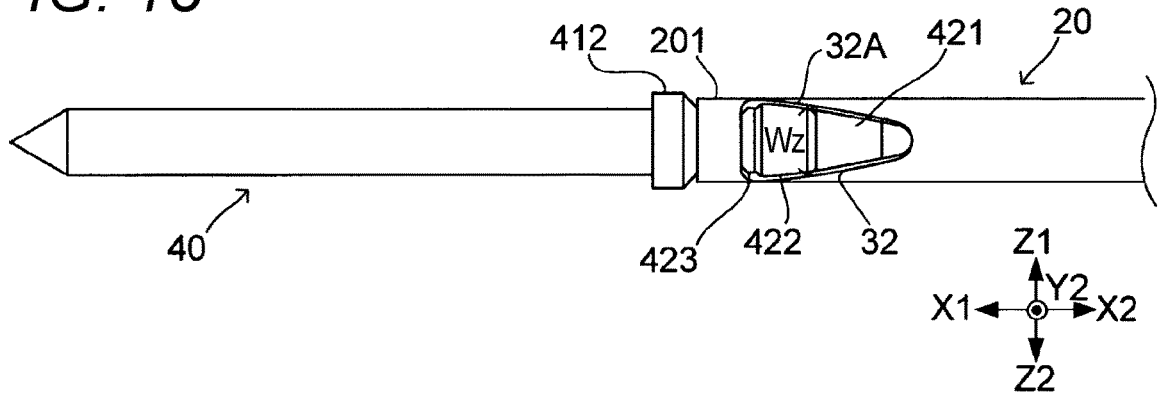
FIG. 18 is a side view illustrating the state of FIG. 14 in which the first conductor is assembled to the tubular body, as viewed from the hole side.

As illustrated in FIG. 18, the hole 32 includes a narrow-width portion 32A having a circumferential width Wz gradually decreased toward the other axial-direction X2 side. This allows the shape of the hole 32 to conform to the shape of the inclined portion 421.

Figure 22:
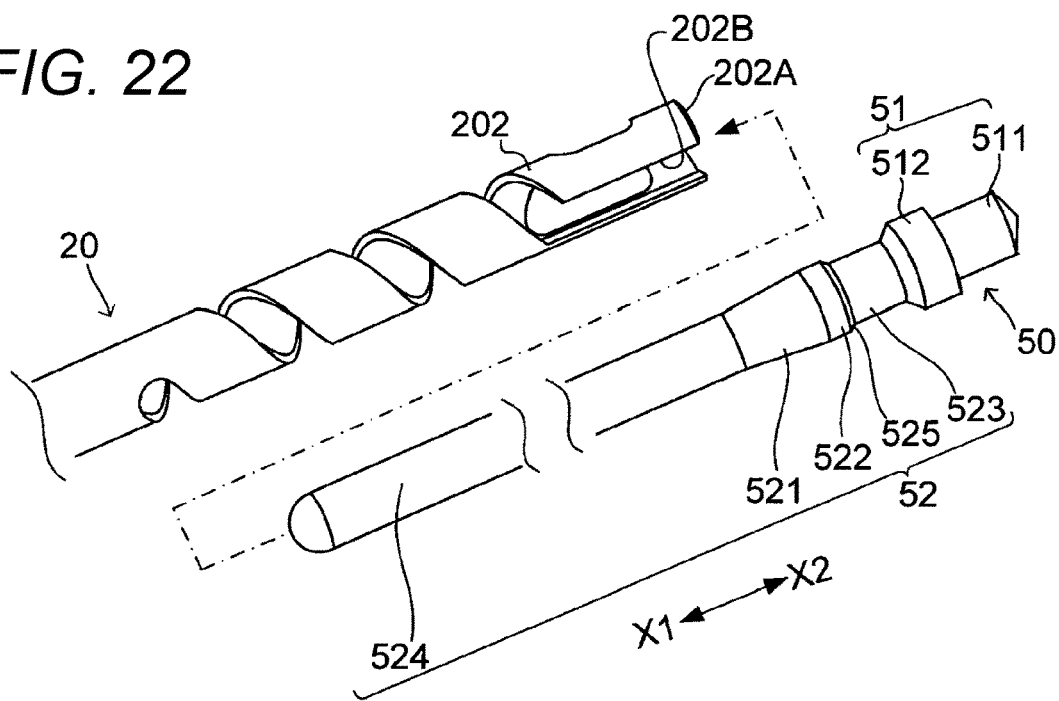
FIG. 22 is a perspective view illustrating an exploded state of a structure for fastening a second conductor to a tubular body, as viewed from an end-side cutout side.
Figure 23:
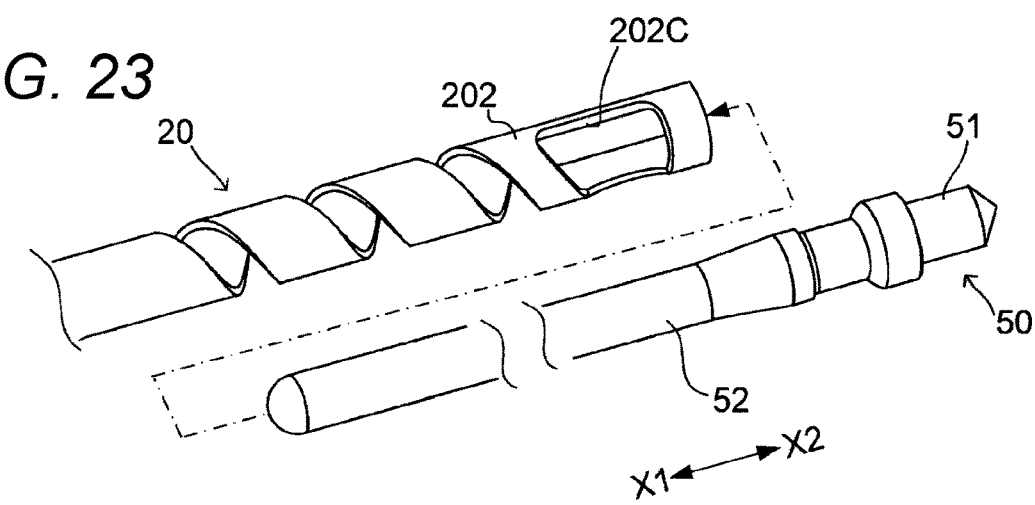
FIG. 23 is a perspective view illustrating the exploded state of the structure for fastening the second conductor to the tubular body, as viewed from a hole side.

A description will now be given of a fastening structure, according to the present embodiment, for fastening the second conductor 50 of the contact terminal 2 to the tubular body 20. FIGS. 22 and 23 are views each illustrating an exploded state before the second conductor 50 is fastened to the tubular body 20. FIG. 22 is a view as viewed from an end-side cutout 202B side of the tubular body 20. FIG. 23 is a view as viewed from a hole 202C side of the tubular body 20.

The other axial-direction end portion 202 of the tubular body 20 has the end-side cutout 202B and the hole 202C.

The end-side cutout 202B is formed in a shape cut out along the axial direction from the other axial-direction end surface 202A of the other axial-direction end portion 202. The hole 202C is open at the other axial-direction end portion 202. The end-side cutout 202B and the hole 202C face each other in a direction (radial direction) perpendicular to the axial direction.

That is, the tubular body 20 has the end-side cutout 202B provided in a shape cut out from the other axial-direction end surface 202A toward the one axial-direction X1 side at the other axial-direction end portion 202 of the tubular body 20, and the hole 202C which is open at the other axial-direction end portion 202.

The second conductor 50 includes the second protrusion 51 that protrudes from the tubular body 20 to the other axial-direction X2 side and the second insertion 52 that is connected to the one axial-direction X1 side of the second protrusion 51 and disposed inside the tubular body 20. The second protrusion 51 includes a flange 512 on the one axial-direction X1 side.

The second insertion 52 includes an inclined portion 521, a third straight portion 522, a narrow portion 523, and a fourth straight portion 524. The inclined portion 521 has an outside diameter gradually increased toward the other axial-direction X2 side. The third straight portion 522 is connected to the other axial-direction X2 side of the inclined portion 521, and has an outside diameter constant along the axial direction.

That is, the second insertion 52 includes the inclined portion 521 having the outside diameter gradually increased toward the other axial-direction X2 side, and the third straight portion 522 connected to the other axial-direction X2 side of the inclined portion 521 and having the outside diameter constant along the axial direction.

The outside diameter of the third straight portion 522 is larger than the inside diameter of the tubular body 20.

The narrow portion 523 is connected to the other axial-direction X2 side of the third straight portion 522 and is connected to the one axial-direction X1 side of the flange 512. The narrow portion 523 has an outside diameter smaller than that of the third straight portion 522.

The fourth straight portion 524 is connected to the one axial-direction X1 side of the inclined portion 521, and has an outside diameter constant along the axial direction.

When the second conductor 50 is assembled to the tubular body 20, the fourth straight portion 524 is inserted into the tubular body 20 from the other axial-direction end surface 202A. As the insertion proceeds, the inclined portion 521 comes into contact with an inner periphery of the other axial-direction end surface 202A. As the second conductor 50 is pushed in as it is, the other axial-direction end portion 202 expands, and the third straight portion 522 is inserted into the tubular body 20.

Figure 24:
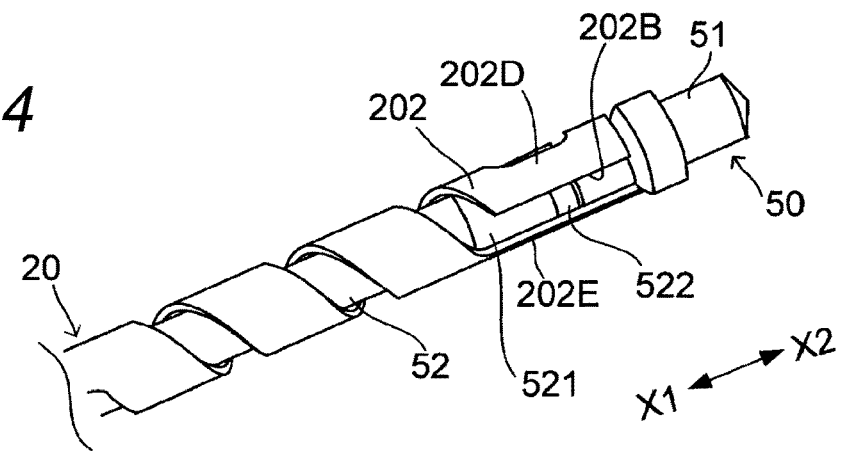
FIG. 24 is a perspective view illustrating the state in which the second conductor is assembled to the tubular body, as viewed from the end-side cutout side.
Figure 25:
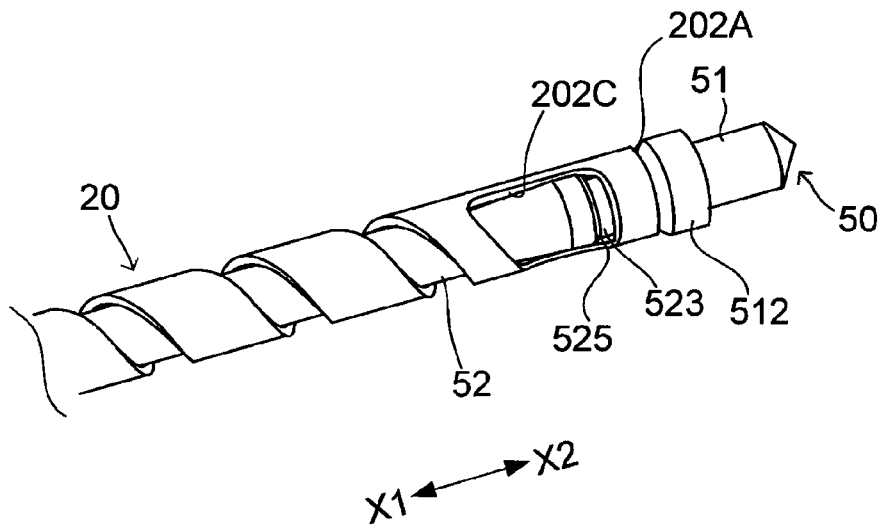
FIG. 25 is a perspective view illustrating the state in which the second conductor is assembled to the tubular body, as viewed from the hole side.

As the insertion further proceeds, the flange 512 comes into contact with the other axial-direction end surface 202A, thus restricting the insertion of the second conductor 50. FIG. 24 illustrates a state in which the second conductor 50 is pushed into the tubular body 20 and the flange 512 is in contact with the other axial-direction end surface 202A in FIG. 22. FIG. 25 illustrates a state in which the second conductor 50 is pushed into the tubular body 20 and the flange 512 is in contact with the other axial-direction end surface 202A in FIG. 23.

In the states illustrated in FIGS. 24 and 25, the third straight portion 522 is pinched from both sides in the direction perpendicular to the axial direction by a pair of arms 202D and 202E of the tubular body 20. The arms 202D and 202E are interposed between the end-side cutout 202B and the hole 202C.

Since the outside diameter of the third straight portion 522 is larger than the inside diameter of the tubular body 20, the third straight portion 522 is pressed by the pair of arms 202D and 202E. That is, the third straight portion 522 is in contact with the arms 202D and 202E. This allows the second conductor 50 to be fastened to the tubular body 20.

Since the tubular body 20 has the end-side cutout 202B and the hole 202C, the other axial-direction end portion 202 easily expands, the second conductor 50 is easily pushed into the tubular body 20, and the second conductor 50 is easily assembled to the tubular body 20.

A wall surface 525 is formed in the level-difference portion between the third straight portion 522 and the narrow portion 523 (FIG. 22). Here, as illustrated in FIG. 25, a distance between the wall surface 525 and the flange 512 is longer than a distance between the hole 202C and the other axial-direction end surface 202A. Consequently, in the state of FIG. 25, the narrow portion 523 is fitted between the hole 202C and the other axial-direction end surface 202A. Then, the wall surface 525 is contactable with the hole 202C.

That is, the wall surface 525 disposed at the other axial-direction end of the third straight portion 522 is contactable with the hole 202C. This allows the second conductor 50 assembled to the tubular body 20 to be less likely to come off from the tubular body 20.

Thus, the fastening structure for fastening the second conductor 50 to the tubular body 20 can achieve the same effect based on the same configuration as the foregoing fastening structure for the first conductor 40.

Since the fourth straight portion 524 is elongated in the axial direction so as to be inserted into the tubular body 20 and contactable with the first body 21 (FIG. 3), the fourth straight portion 524 is long in axial length and increases the effect of reducing the inclination of the second conductor 50 with respect to the tubular body 20.

Figure 26:
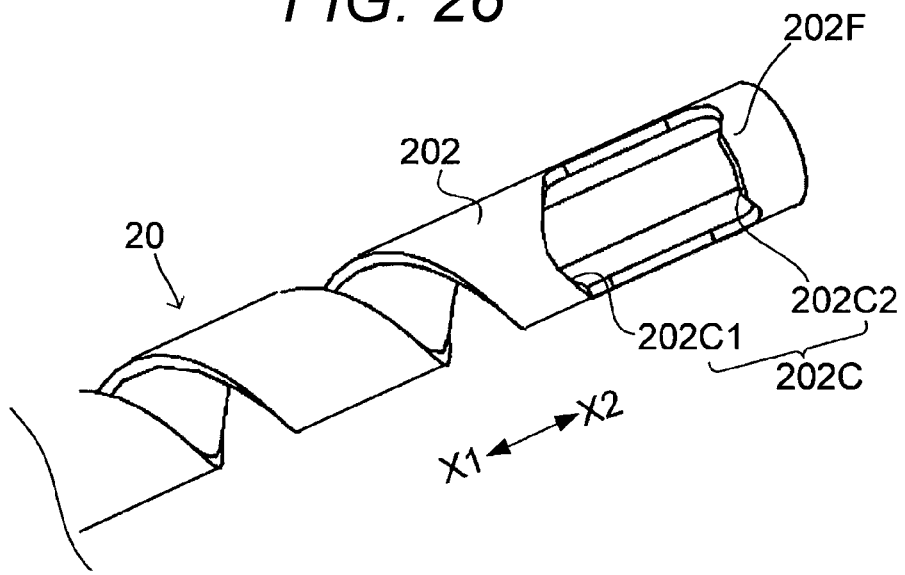
FIG. 26 is a perspective view illustrating a modification of the other axial-direction end portion of the tubular body.

Furthermore, the other axial-direction end portion 202 may have a configuration as illustrated in FIG. 26. In FIG.

26, in front view of the hole 202C, the hole 202C is formed to be line-symmetric with respect to the central axis of the tubular body 20. The hole 202C has a recess 202C1 on the one axial-direction X1 side and a protruding edge 202C2 on the other axial-direction X2 side. The recess 202C1 is recessed to the one axial-direction X1 side. The other axial-direction end portion 202 includes a protrusion 202F protruding to the one axial-direction X1 side. The protruding edge 202C2 is an edge of the protrusion 202F.

While the embodiments of the present disclosure have been described above, the embodiments can be modified in various ways within the scope of the present disclosure.

For example, the foregoing fastening structure for the conductor can also be applied to a contact terminal in which two sliding contact points are formed by conductors disposed on both sides in an axial direction and a body at an intermediate position of a tubular body into which the conductors are inserted. In addition, the fastening structure may be applied to a contact terminal configured by fastening only one conductor to a tubular body.

The present disclosure is applicable to electrical inspections of, for example, various inspection targets.

Features of the above-described embodiments and the modifications thereof may be combined appropriately as long as no conflict arises.

While embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:
1. A contact terminal comprising:
   a tubular body elongated in an axial direction of the contact terminal and having conductivity; and
   a first conductor having conductivity and a rod shape, wherein
   the tubular body has
      an end-side cutout provided in a shape cut out from one axial-direction end surface toward an other axial-direction side at one axial-direction end portion of the tubular body,
      a hole that is open at the one axial-direction end portion, and
      a pair of arms interposed between the end-side cutout and the hole, the first conductor includes
      a first protrusion protruding from the tubular body toward one axial-direction side, and
      a first insertion connected to an other axial-direction side of the first protrusion and disposed inside the tubular body,
   the first insertion includes
      an inclined portion having an outside diameter gradually increased toward the one axial-direction side, and
      a first straight portion connected to one axial-direction side of the inclined portion and having an outside diameter constant along the axial direction,
   the outside diameter of the first straight portion is larger than an inside diameter of the tubular body,
   the first straight portion is configured to be in contact with the pair of arms, and
   the first straight portion includes a wall surface disposed at one axial-direction end of the first straight portion and contactable with the hole.

2. The contact terminal according to claim 1, wherein the first protrusion includes a flange axially facing the one axial-direction end surface of the tubular body.

3. The contact terminal according to claim 2, wherein a distance between the wall surface and the flange is substantially equal to a distance between the hole and the one axial-direction end surface.

4. The contact terminal according to claim 1, wherein the first straight portion is partially exposed from the hole.

5. The contact terminal according to claim 1, wherein
   the first insertion includes a second straight portion connected to an other axial-direction side of the inclined portion and having an outside diameter constant along the axial direction, and
   the second straight portion has an outside diameter substantially identical to the inside diameter of the tubular body.

6. The contact terminal according to claim 1, wherein
   the hole includes an axially protruding edge that is an edge of an axial protrusion protruding toward the other axial-direction side at the one axial-direction end portion, and
   the wall surface is contactable with the axially protruding edge.

7. The contact terminal according to claim 1, wherein
   the one axial-direction end portion includes a pair of circumferential protrusions protruding in a circumferential direction so as to approach each other, and
   the hole includes circumferential protruding edges that are edges of the pair of circumferential protrusions.

8. The contact terminal according to claim 1, wherein
   the end-side cutout includes a constant width portion having a width constant along the axial direction, and
   the constant width portion is elongated from the one axial-direction end surface to a position overlapping the inclined portion as viewed in a first direction perpendicular to the axial direction.

9. The contact terminal according to claim 1, wherein the hole includes a narrow-width portion having a circumferential width gradually decreased toward the other axial-direction side.

10. The contact terminal according to claim 1, wherein the end-side cutout includes a wide portion having a width gradually increased toward the other axial-direction side.

11. The contact terminal according to claim 1, wherein the first conductor has a rotating body shape around the axial direction.

12. The contact terminal according to claim 1, further comprising a second conductor having conductivity and a rod shape,
   wherein
   the second conductor includes a second insertion disposed inside the tubular body,
   the tubular body has
      a second end-side cutout provided in a shape cut out from an other axial-direction end surface toward the one axial-direction side at an other axial-direction end portion of the tubular body,
      a second hole that is open at the other axial-direction end portion, and
      a pair of second arms interposed between the second end-side cutout and the second hole,
   the second insertion includes
      a second inclined portion having an outside diameter gradually increased toward the other axial-direction side, and a third straight portion connected to the other axial-direction side of the second inclined portion and having an outside diameter constant along the axial direction, the outside diameter of the third straight portion is larger than the inside diameter of the tubular body, the third straight portion is configured to be in contact with the pair of second arms, and the third straight portion includes a wall surface disposed at an other axial-direction end of the third straight portion and contactable with the second hole.

13. An inspection jig comprising:

a plurality of contact terminals each being the contact terminal according to claim 1; and a support member that supports the plurality of contact terminals.

14. An inspection apparatus comprising:

the inspection jig according to claim 13; and an inspection processor configured to inspect an inspection target based on an electrical signal obtained by bringing each of the plurality of contact terminals into contact with a corresponding one of inspection points provided on the inspection target.

15. The contact terminal according to claim 2, wherein the first straight portion is partially exposed from the hole.

16. The contact terminal according to claim 3, wherein the first straight portion is partially exposed from the hole.

17. The contact terminal according to claim 2, wherein the first insertion includes a second straight portion connected to an other axial-direction side of the inclined portion and having an outside diameter constant along the axial direction, and the second straight portion has an outside diameter substantially identical to the inside diameter of the tubular body.

18. The contact terminal according to claim 3, wherein the first insertion includes a second straight portion connected to an other axial-direction side of the inclined portion and having an outside diameter constant along the axial direction, and the second straight portion has an outside diameter substantially identical to the inside diameter of the tubular body.

19. The contact terminal according to claim 4, wherein the first insertion includes a second straight portion connected to an other axial-direction side of the inclined portion and having an outside diameter constant along the axial direction, and the second straight portion has an outside diameter substantially identical to the inside diameter of the tubular body.

20. The contact terminal according to claim 2, wherein the hole includes an axially protruding edge that is an edge of an axial protrusion protruding toward the other axial-direction side at the one axial-direction end portion, and the wall surface is contactable with the axially protruding edge.

* * * * *